(12) United States Patent
Hagihara

(10) Patent No.: US 6,329,844 B2
(45) Date of Patent: Dec. 11, 2001

(54) SEMICONDUCTOR INTEGRATED CIRCUIT

(75) Inventor: Yasuhiko Hagihara, Tokyo (JP)

(73) Assignee: NEC Corporatation, Tokyo (JP)

( * ) Notice: Subject to any disclaimer, the term of this patent is extended or adjusted under 35 U.S.C. 154(b) by 0 days.

(21) Appl. No.: 09/756,175

(22) Filed: Jan. 9, 2001

Related U.S. Application Data

(62) Division of application No. 09/458,999, filed on Dec. 10, 1999.

(30) Foreign Application Priority Data

Dec. 28, 1998 (JP) .................................................. 10-371769

(51) Int. Cl.$^7$ ..................... H03K 19/094; H03K 19/0175
(52) U.S. Cl. ................................. 326/83; 326/86; 326/113
(58) Field of Search .................................. 326/83, 86, 95, 326/97, 98, 113

(56) References Cited

U.S. PATENT DOCUMENTS

| | | | |
|---|---|---|---|
| 4,342,927 | * 8/1982 | Hull | 326/98 |
| 5,115,150 | * 5/1992 | Ludwig | 326/86 |
| 5,889,417 | * 3/1999 | Klass et al. | 326/98 |
| 6,140,835 | * 10/2000 | Shirai | 326/24 |
| 6,147,513 | * 11/2000 | Bui | 326/83 |
| 6,160,422 | * 12/2000 | Huang | 326/95 |

FOREIGN PATENT DOCUMENTS

04100411-A * 4/1992 (JP) ..................................... 326/31

OTHER PUBLICATIONS

Neil H E. Weste et al., "Principles of CMOS VLSI Design", pp. 141–144.

* cited by examiner

*Primary Examiner*—Michael Tokar
*Assistant Examiner*—Steven S. Paik
(74) *Attorney, Agent, or Firm*—Young & Thompson

(57) ABSTRACT

A semiconductor integrated circuit enables a drive circuit and a reception circuit to be constituted. The drive circuit drives long wiring in high speed while achieving realization of reduced area when large capacity of load is driven. The reception circuit receives this signal in high speed. There is provided an inverter within the drive circuit. An n-type MOS transistor is adopted as drive transistor. Drive power of the n-type MOS transistor is larger than that of a p-type MOS transistor. It is capable of driving signal with large load in long wiring such as bus line. Thus the drive circuit is realized in that the drive circuit drives the long wiring in high speed while achieving realization of reduced area. Further, it is capable of realizing a reception circuit suppressing through-current during the time period when the signal is changed.

6 Claims, 5 Drawing Sheets

SEMICONDUCTOR INTEGRATED CIRCUIT

CROSS-REFERENCE TO RELATED APPLICATIONS

This application is a division of copending application Ser. No. 09/458,999, filed Dec. 10, 1999.

BACKGROUND OF THE INVENTION

The present invention relates to a semiconductor integrated circuit which is used for general purpose or special purpose. More to particularly, this invention relates to a semiconductor integrated circuit which is appropriately used as a drive circuit for driving long wiring in high speed or a reception circuit for receiving signal through the long wiring.

Description of the Prior Art

Formerly, in the semiconductor integrated circuit using CMOS (Complementary Metal Oxide Semiconductor) and so forth, CMOS domino logic reported in pp. 143 of "Principles of CMOS VLSI Design" published by Maruzen Co., Ltd., (Author: Neil H. E. Weste & Kamran Eshraghian) is well known as a method for achieving realization of high speed operation and a method for achieving realization of reduced area.

FIG. 1 is a circuit diagram showing a constitution of a drive circuit consisting of such kind of conventional semiconductor integrated circuit.

In FIG. 1, a reference numeral 10 shows a logic circuit. The logic circuit consists of n-type (n-channel) MOS transistors. The logic circuit consists of p-type (p-channel) MOS transistors. The logic circuit consists of both of n-type MOS transistor and p-type MOS transistor. Reference numerals 11, and 17 show n-type (n-channel) MOS transistors. Reference numerals 14, 15, and 18 show p-type (p-channel) MOS transistors. A reference character 'S' shows source. A reference character 'D' shows drain. A reference character 'G' shows gate. A reference numeral 20 shows an input terminal to which clock and so forth are inputted. Reference numerals 21, and 22 show data input terminals to which data and so forth are inputted. A reference numeral 24 shows an output terminal. Reference numerals 40, 41 show ground (earth). Reference numerals 42, 43, and 44 show electric power-supply Vdd.

In a circuit connection constitution as shown in FIG. 1, an inverter 19 is constituted by an n-type MOS transistor 17 and a P-type MOS transistor 18. A p-type MOS transistor 15 has feeble drive power. The p-type MOS transistor 15 always maintains ON-state. However, the p-type MOS transistor 15 does not influence operation of the semiconductor integrated circuit.

Here, a signal is supplied Lo the input terminal 20. When level of signal is Low-level, the n-type MOS transistor 11 becomes OFF-state. Simultaneously, the p-type MOS transistor 14 becomes ON-state. Consequently, level of an input of the inverter 19 becomes H-level. As a result, level of a signal which is outputted from the output terminal 24 becomes L-level.

Next, level of the signal supplied to the input terminal 20 becomes H-level. The logic circuit 10 becomes ON-state according to combination between the data input terminals 21, and 22. On the occasion of this condition, level of the logic circuit and level of an input node of the inverter 19 through the n-type MOS transistor 11 become L-level, thus level of the output becomes H-level.

Now, in the above-described conventional drive circuit, a transistor causes level of the output terminal 24 to be driven to H-level. The above-described transistor is the p-type MOS transistor 18. The drive power of the p-type MOS transistor 18 is smaller than that of the n-type MOS transistor. A p-type MOS transistor 18 with large drive power is required for the case where long wiring is driven. As a result, if the p-type MOS transistor with large power is used, occupied area of the p-type MOS transistor becomes large. So there occurs the problem that response speed lowers. This problem becomes a main cause that blocks realization of high speed operation and realization of reduced area of the whole semiconductor integrated circuit.

On the other hand, there is a reception circuit. The reception circuit receives signal through the long wiring from the conventional drive circuit described-above. When such the reception circuit is constituted, a regular inverter is used. However, when wave-form change of input is gentle, through-current flows in the inverter. Thus there is the problem that delay time becomes large.

SUMMARY OF THE INVENTION

In view of the foregoing, it is an object of the present invention, in order to overcome the above-mentioned problem, to provide a semiconductor integrated circuit which is capable of constituting both of a drive circuit that enables long wiring to be driven in high speed while achieving reduced area and a reception circuit for receiving signal thereof in high speed.

According to a first aspect of the present invention, in order to achieve the above mentioned object, there is provided a semiconductor integrated circuit which comprises a first p-type MOS transistor whose source is connected to an electric power-supply, whose gate is connected to a first input terminal, and whose drain is connected to a first node respectively, a second p-type MOS transistor whose source is connected to the electric power-supply, whose gate is connected to a second node, and whose drain is connected to the first node respectively, a logic circuit consisting of plural n-type MOS transistors to which a second input terminal, ground, and the first node are connected respectively, a first inverter in which the first node is taken to be an input, and the second node is taken to be an output, a first n-type MOS transistor whose drain is connected to the electric power-supply, whose gate is connected to the second node, and whose source is connected to a first output terminal respectively, and a second n-type MOS transistor whose source is connected to the ground, whose gate is connected to the first node, and whose drain is connected to the first output terminal respectively.

According to a second aspect of the present invention, in the first aspect, there is provided a semiconductor integrated circuit, wherein the logic circuit is connected to a third node, and to the ground through a third n-type MOS transistor; and source of the third n-type MOS transistor is connected to ground, gate of the third n-type MOS transistor is connected to the first input terminal, and drain of the third n-type MOS transistor is connected to the third node respectively.

According to a third aspect of the present invention, in the first or the second aspects, there is provided a semiconductor integrated circuit, wherein the semiconductor integrated circuit is constituted as a drive circuit for driving an external circuit.

According to a fourth aspect of the present invention, there is provided a semiconductor integrated circuit which comprises a first p-type MOS transistor whose source is connected to an electric power-supply, whose gate is connected to a first node, and whose drain is connected to a second node respectively, a second p-type MOS transistor whose source is connected to the second node, whose gate is connected to a first input terminal, and whose drain is connected to a first output terminal respectively, a first n-type MOS transistor whose source is connected to ground, whose gate is connected to a fifth node, and whose drain is connected to a third node respectively, a second n-type MOS transistor whose source is connected to the third node, whose gate is connected to the first input terminal, and whose drain is connected to the first output terminal respectively, and a logic circuit in which the first output terminal and the second input terminal are taken to be an input, and the first node and the fifth node are taken to be an output.

According to a fifth aspect of the present invention, in the fourth aspect, there is provided a semiconductor integrated circuit, which further comprises a first inverter in which the first output terminal is taken as an input, and a fourth node is taken as an output, and a second inverter in which the fourth node is taken to be an input, and a first output terminal is taken to be an output.

According to a sixth aspect of the present invention, in the fourth or the fifth aspect, there is provided a semiconductor integrated circuit, wherein the semiconductor integrated circuit constitutes a reception circuit for receiving signal from an external circuit.

As described-above, since there is provided the inverter on the inside of the drive circuit. The n-type MOS transistor is adopted as the drive transistor. The n-type MOS transistor has larger drive power than the p-type MOS transistor. So it is capable of driving the signal with large load in high speed in the long wiring such as a bus line. On the other hand, it is capable of suppressing the through-current flowing into the reception circuit during time period when the output of the drive circuit is changed, thus it is capable of providing high speed drive circuit.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

A preferred embodiment of the present invention will now be described in detail in accordance with the accompanying drawings.

Figure 1:
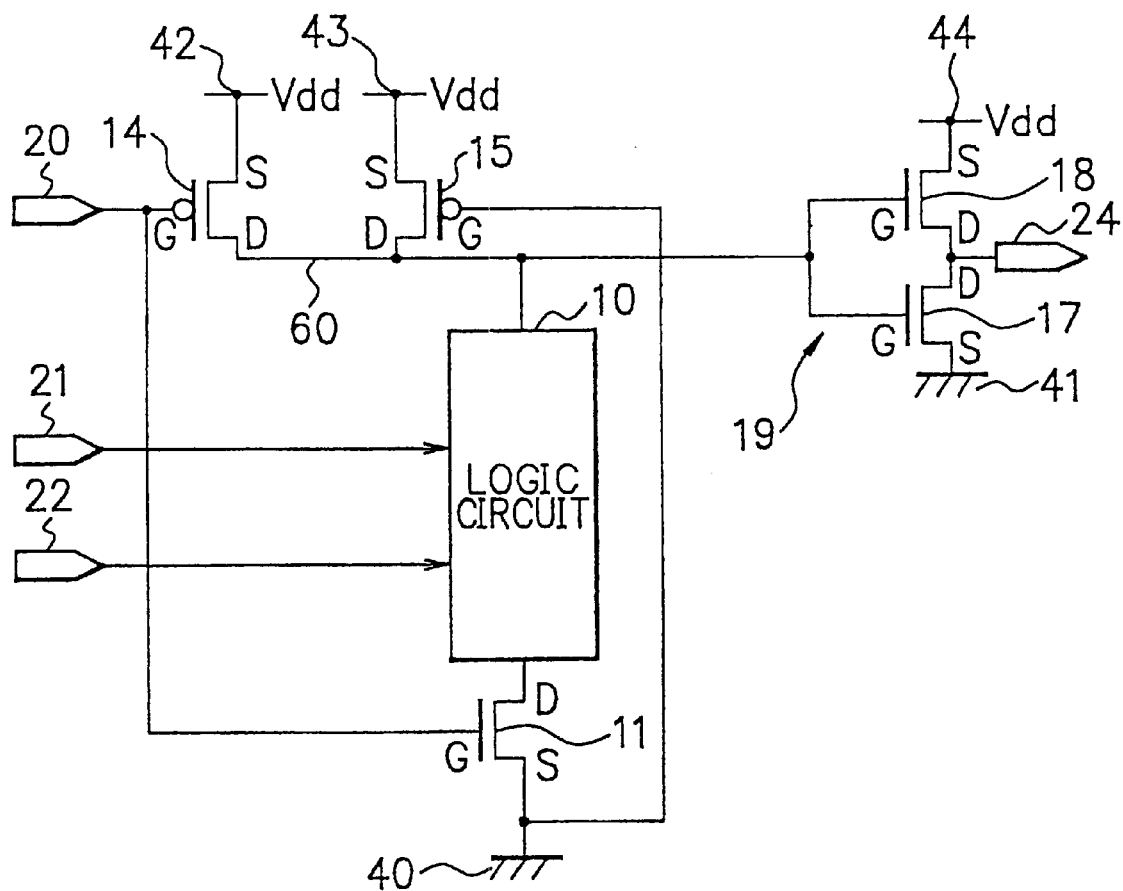
FIG. 1 is a circuit diagram showing a constitution of a conventional drive circuit.
Figure 2:
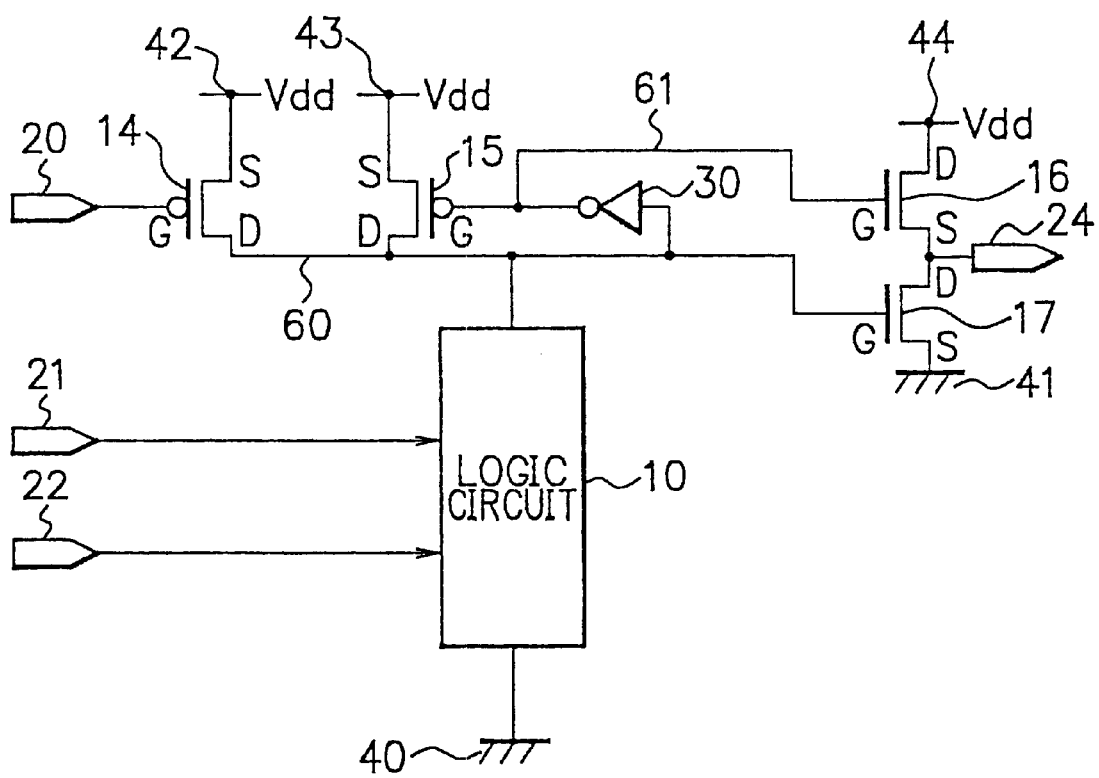
FIG. 2 is a circuit diagram showing a constitution of a drive circuit of a first embodiment of the present invention.
Figure 3:
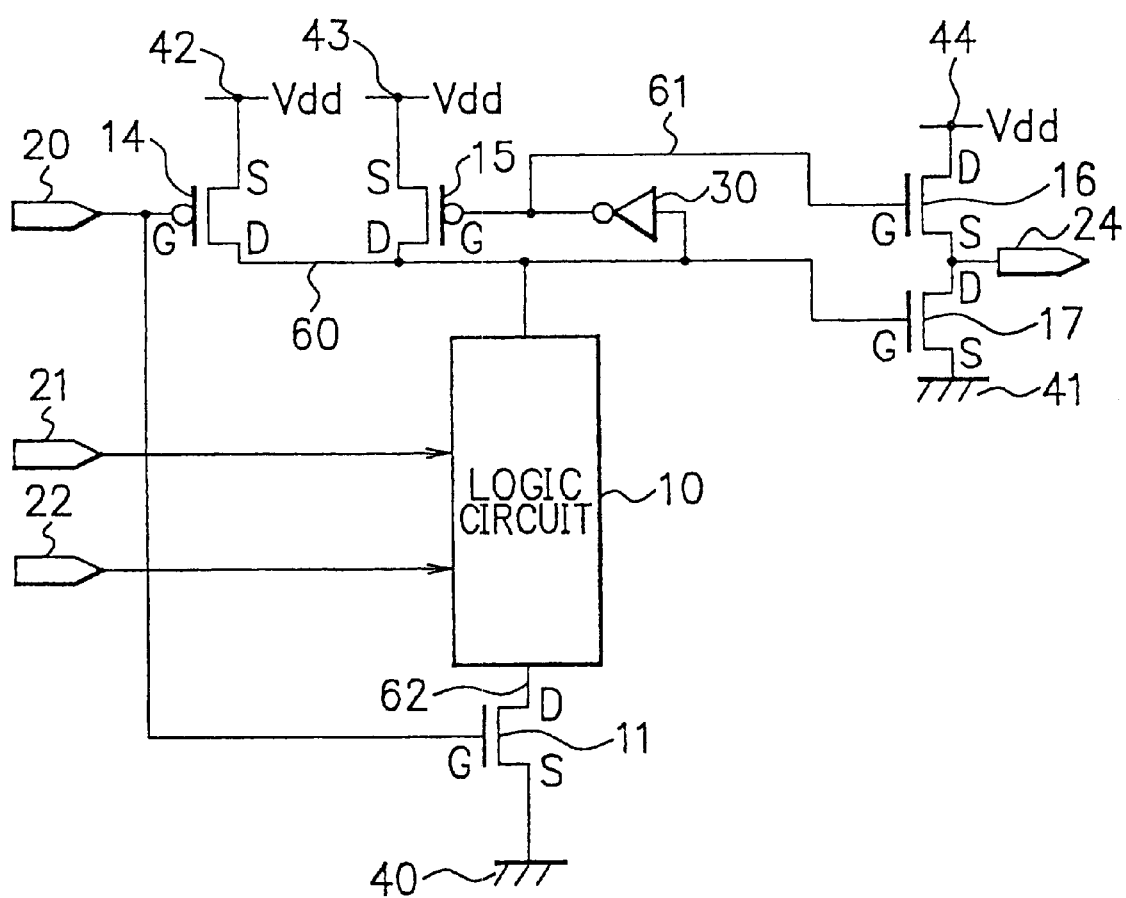
FIG. 3 is a circuit diagram showing a constitution of a drive circuit of a second embodiment of the present invention.
Figure 4:
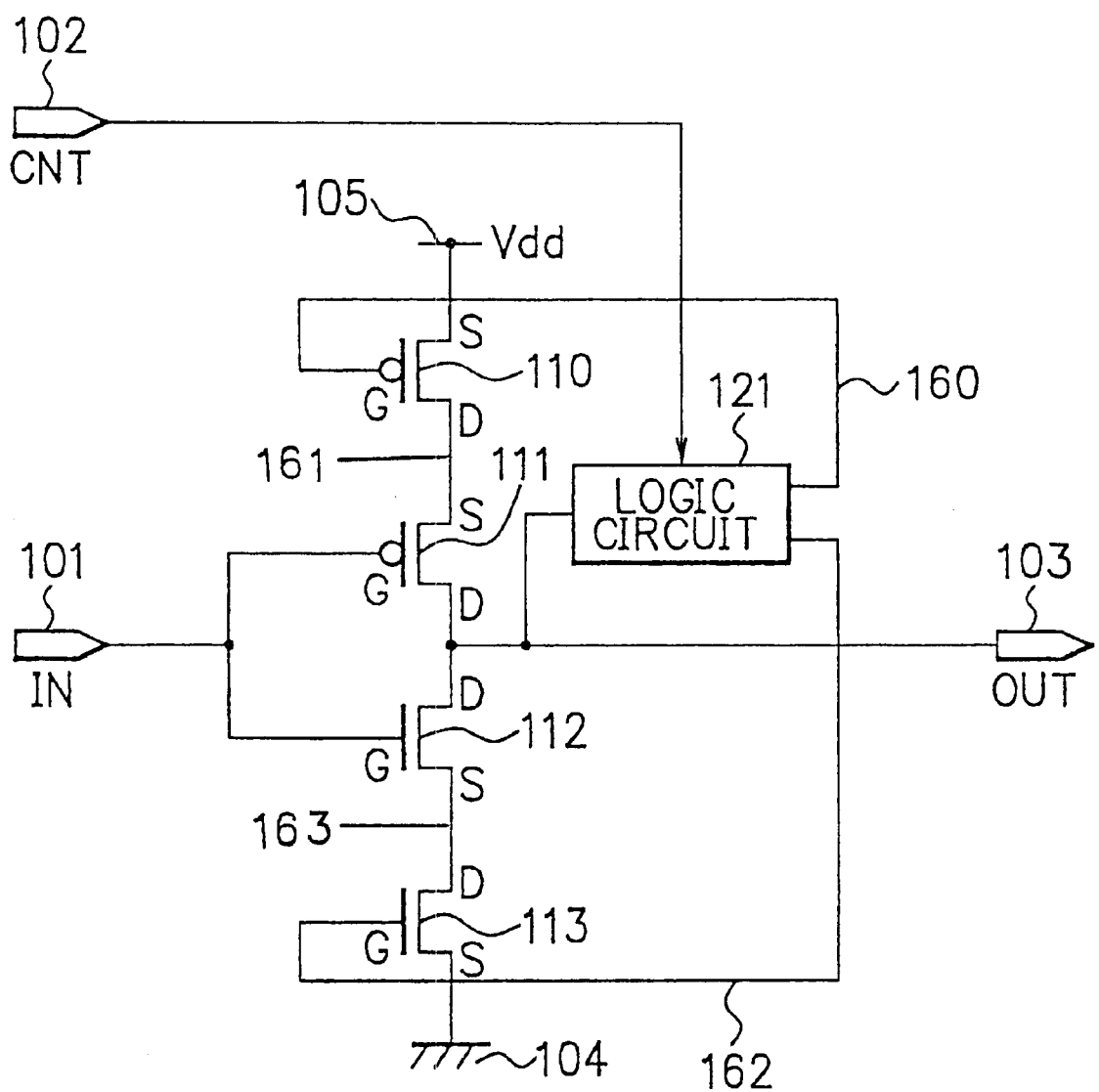
FIG. 4 is a circuit diagram showing a constitution of a reception circuit of a third embodiment of the present invention.
Figure 5:
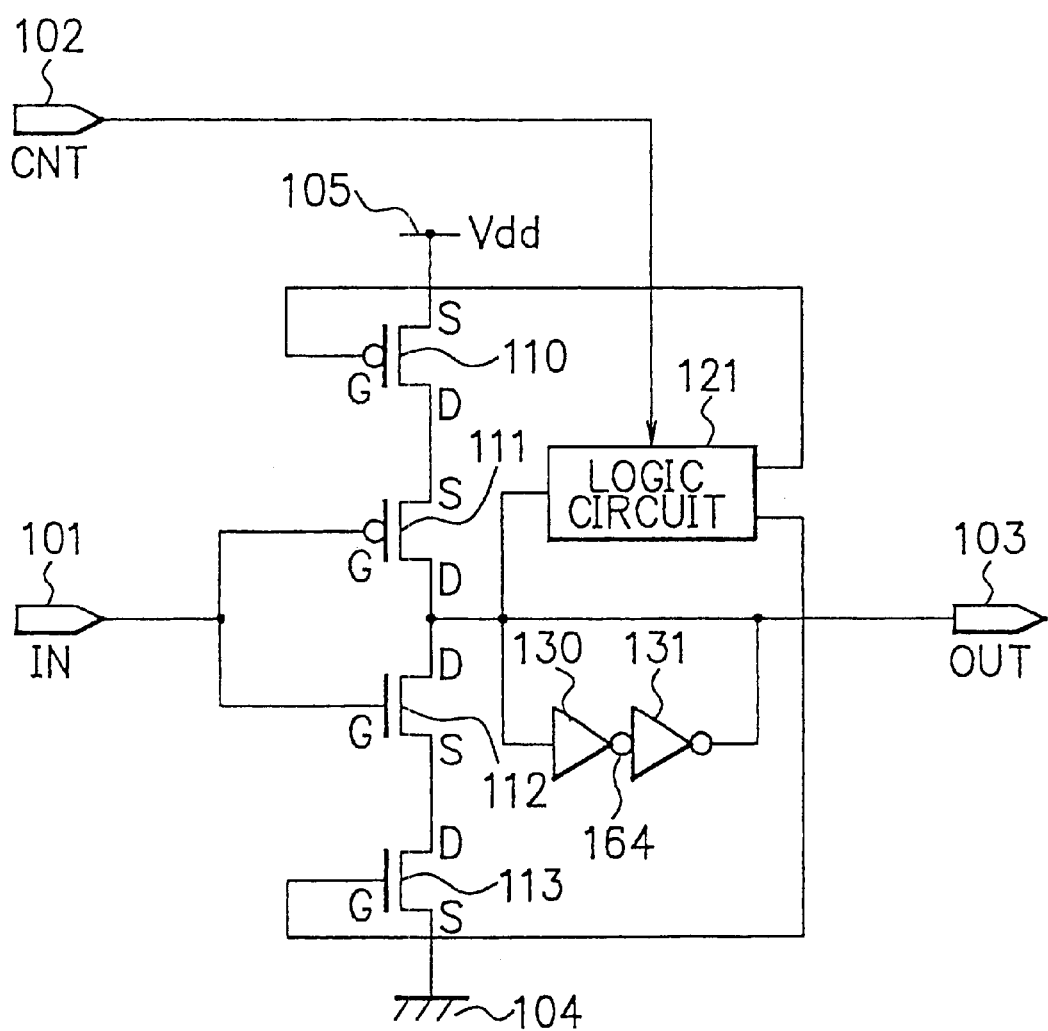
FIG. 5 is a circuit diagram showing a constitution of reception circuit of a fourth embodiment of the present invention.

FIG. 2 is a circuit diagram showing a constitution of a drive circuit of the first embodiment of the semiconductor integrated circuit of the present invention. FIG. 3 is a circuit diagram showing a constitution of a drive circuit of the second embodiment of the semiconductor integrated circuit of the present invention. FIG. 4 is a circuit diagram showing a constitution of a reception circuit of a third embodiment of the semiconductor integrated circuit of the present invention. FIG. 5 is a circuit diagram showing a constitution of reception circuit of a fourth embodiment of the semiconductor integrated circuit of the present invention.

Firstly, there will be described constitution and operation of the first embodiment of the present invention referring to FIG. 2.

In FIG. 2, a reference numeral 10 shows a logic circuit. The logic circuit consists of n-type (n-channel) MOS transistors. The logic circuit consists of p-type (p-channel) MOS transistors. The logic circuit consists of both of n-type MOS transistor and p-type MOS transistor. Reference numerals 16, and 17 show n-type (n-channel) MOS transistors. Reference numerals 14, and 15, show p-type (p-channel) MOS transistors. A reference character 'S' shows source. A reference character 'D' shows drain. A reference character 'G' shows gate. A reference numeral 20 shows an input terminal to which clock and so forth are inputted. Reference numerals 21, and 22 show data input terminals to which data and so forth are inputted. A reference numeral 24 shows an output terminal. Reference numerals 40, and 41 show ground (earth). Reference numerals 42, 43, and 44 show electric power-supply (Vdd).

The electric power-supply 42 is connected to the source 'S' of the first p-type MOS transistor 14. The input terminal 20 is connected to the gate 'G' of the first p-type MOS transistor 14. A first node 60 is connected to the drain 'D' of the first p-type MOS transistor 14. Further, the electric power-supply 43 is connected to the source 'S' of the second p-type MOS transistor 15. A second node 61 is connected to the gate 'G' of the second p-type MOS transistor 15. The first node 60 is connected to the drain 'D' of the second p-type MOS transistor 15. Furthermore, the data input terminals 21, and 22, the ground 40, and the first node 60 are connected to the logic circuit 10 respectively. The first inverter 30 is connected to the logic circuit 10. The input of the first inverter 30 is connected to the first node 60. The output of the first inverter 30 is connected to the second node 61.

Namely, in the first inverter 30, the first node 60 is taken to be the input, and the second node is taken to be an output.

On the other hand, the electric power-supply 44 is connected to the drain 'D' of the first n-type MOS transistor 16. The second node 61 is connected to the gate 'G' of the first n-type MOS transistor 16. The first output terminal 24 is connected to the source 'S' of the first n-type MOS transistor 16. Further, the ground is connected to the source 'S' of the second n-type MOS transistor 17. The first node 60 is connected to the gate 'G' of the second n-type MOS transistor 17. The first output terminal 24 is connected to the drain 'D' of the second n-type MOS transistor 17.

In such the circuit connection constitution, the p-type MOS transistor 15 has only feeble drive power. The ON/OFF operation state of the p-type MOS transistor 15 does not influence logic operation of the others. Here, 'Low'-level indicates low electric potential and 'Hi'-level indicates high electric potential.

Here, there will be described operation on the supposition that when level of the input terminal 20 is 'Low'-level, the logic circuit 10 is OFF state. Under the operation condition, the p-type MOS transistor 14 becomes ON state. The first node 60 becomes therefore 'Hi'-level. The second node 61 becomes 'Low'-level. As a result, the output terminal 24 becomes 'Low'-level.

Next, when level of the input terminal 20 becomes 'Hi'-level, the logic circuit 10 becomes ON state according to combination between the data input terminals 21, and 22. On this occasion, the first node 60 becomes 'Low'-level, and the second node 61 becomes 'Hi'-level. As a result, the output terminal 24 becomes 'Hi'-level. Here, if the logic circuit 10 is OFF state, the output terminal 24 maintains 'Low'-level.

Thus, the inverter 30 is provided on the inside of the drive circuit. One pair of the drive transistors consist of the n-type MOS transistors 16, and 17 with large drive power. Because of these constitutions, the drive circuit causes high speed drive of the long wiring to be capable, and it is capable of reducing occupied area, in comparison with the conventional constitution where the p-type MOS transistor is used.

Next, there will be described constitution and operation of drive circuit according to a second embodiment of the present invention referring to FIG. 3.

As shown in FIG. 3, in addition to the circuit constitution shown in FIG. 2, the logic circuit 10 is connected to the ground 40 through a third node 62, and a third n-type MOS transistor 11. The ground is connected to the source 'S' of the third n-type MOS transistor 11. The input terminal 20 is connected to the gate 'G' of the third n-type MOS transistor 11. The third node 62 is connected to the drain 'D' of the third n-type MOS transistor 11.

In such the circuit connection constitution, the p-type MOS transistor 15 has only feeble drive power. The ON/OFF operation state of the p-type MOS transistor 15 does not influence logic operation of the others.

When the input terminal 20 is 'Low'-level, the third n-type MOS transistor 11 becomes OFF state. The p-type MOS transistor 14 becomes ON state. The node 60 becomes 'Hi'-level. The node 61 becomes 'Low'-level.

As a result the output terminal 24 becomes 'Low'-level.

Next, when the input terminal 20 becomes 'Hi'-level, if the logic circuit 10 becomes ON state according to combination between the data input terminals 21, and 22, the node 60 becomes 'Low'-level, and the node 61 becomes 'Hi'-level, as a result, the output terminal 24 becomes 'Hi'-level. Here, when the logic circuit 10 maintains OFF state, the output terminal 24 maintains 'Low'-level.

Next, there will be described constitution and operation of a reception circuit according to a third embodiment of the present invention referring to FIG. 4.

In FIG. 4, a reference numeral 101 shows an input terminal. A reference numeral 102 shows a control signal input terminal. A reference numeral 103 shows an output terminal. A reference numeral 104 shows ground. A reference numeral 105 shows an electric power-supply (Vdd). Further, reference numerals 110, and 111 show p-type MOS transistors. Reference numerals 112, and 113 show n-type MOS transistors. A reference numeral 121 shows a logic circuit.

An electric power-supply 105 is connected to source 'S' of a first p-type MOS transistor 110. A first node 160 is connected to gate 'G' of the first p-type MOS transistor 110. A second node 161 is connected to drain 'D' of the first p-type MOS transistor 110.

A second node 161 is connected to source 'S' of a second p-type MOS transistor 111. A first input terminal 101 is connected to gate 'G' of the second p-type MOS transistor. An output terminal 103 is connected to drain 'D' of the second p-type MOS transistor 111.

On the other hand, ground 104 is connected to source 'S' of a first n-type MOS transistor 113. A fifth node 162 is connected to gate 'G' of the first n-type MOS transistor 113. A third node 163 is connected to drain 'D' of the first n-type MOS transistor 113.

The third node 163 is connected to source 'S' of a second n-type MOS transistor 112. The first input terminal 101 is connected to gate 'G' of the second n-type MOS transistor 112. The output terminal 103 is connected to drain 'D' of the second n-type MOS transistor 112.

Further, with respect to the logic circuit 121, the output terminal 103 and a control signal input terminal 102 are taken to be an input, and the first node 160 and the fifth node 162 are taken to be an output. The logic circuit 121 separately controls operation of the p-type MOS transistor 110 and the n-type MOS transistor 113 based on control signal supplied through the control signal input terminal 102.

In this case, there exists three operation modes.

(1) The p-type MOS transistor 110 is always OFF state. The n-type MOS transistor 113 is always OFF state. In such the case, the output terminal 103 becomes floating node without depending on the signal supplied to the input terminal 101, thus being used as non-selective output of a selector.

(2) The p-type MOS transistor 110 is always ON state. The n-type MOS transistor 113 is always ON state. In such the case, the logic circuit 121 operates as regular inverter.

(3) The logic circuit 121 operates as the inverter when the logic gate causes the signal outputted from the output terminal 103 to be delayed as much as fixed time period. In this case, it is capable of preventing situation that the whole of four transistors the p-type MOS transistors 110, and 111, and the n-type MOS transistors 112, and 113 become ON state. Therefore, high-speed operation becomes possible. Furthermore, the p-type MOS transistor 110 is controlled independently from the n-type MOS transistor 113, thus it becomes possible to achieve resistant to noise and optimization of delay time.

According to the above-described reception circuit, in the time period when input is changed, since the through-current is suppressed, high speed operation becomes possible.

Next, there will be described constitution and operation of a reception circuit according to a fourth embodiment of the present invention referring to FIG. 5.

As shown in FIG. 5, in addition to the circuit constitution shown in FIG. 4, there is the first inverter 130 whose input is connected to the output terminal 103, and whose output is connected to the fourth node 164. There is the second inverter 131 whose input is connected to the fourth node 164, and whose output is connected to the output terminal 103. Thus the first inverter 130 is connected to the second inverter 131 in series through the fourth node 164.

The logic circuit 121 controls the p-type MOS transistor 110 based on the control signal supplied through the control signal input terminal 102. The logic circuit 121 controls the n-type MOS transistor 113 based on the control signal supplied through the control signal input terminal 102. The operation of the p-type MOS transistor 110 is controlled by the logic circuit 121 separately from the operation of the n-type MOS transistor 113.

In this case, for instance, there are three operation modes.

(1) The p-type MOS transistor 110 is always OFF state. The n-type MOS transistor 113 is always OFF state. In this occasion, the output of the output terminal 103 is maintained without depending on signal supplied to the input terminal 101, thus the logic circuit 121 operates as a latch.

(2) The p-type MOS transistor 110 is always ON state. The n-type MOS transistor 113 is always ON state. In such the case, the logic circuit 121 operates as regular inverter.

(3) The logic circuit 121 operates as the inverter when the logic gate causes the signal outputted from the output terminal 103 to be delayed as much as fixed time period. In this case, it is capable of preventing situation that the whole of four transistors the p-type MOS transistors 110, and 111, and the n-type MOS transistors 112, and 113 become ON state. Therefore, high-speed operation becomes possible. Furthermore, the p-type MOS transistor 110 is controlled independently to the n-type MOS transistor 113, thus it becomes possible to achieve resistant to noise and optimization of delay time.

The inverter 131 is constituted by element which is element having characteristic that drive power is relatively small. An electric potential of the output terminal 103 does not approach to the electric power-supply 105 or the ground 104 sufficiently. The inverter 131 operates in such a way that the inverter 131 causes the electric potential to be approached to the electric power supply 105 or the ground 104 gradually.

Further, the present invention is not restricted by the above mentioned respective embodiments. Within the limit of technical subject matter of the present invention, modification is implemented appropriately.

As described above, according to the semiconductor integrated circuit of the present invention, there is provided the inverter on the inside of the drive circuit. The n-type MOS transistor is adopted as the drive transistor. The n-type MOS transistor has larger drive power than the p-type MOS transistor. So it is capable of driving the signal with large load in high speed in the long wiring such as a bus line. On the other hand, it is capable of suppressing the through-current flowing into the reception circuit during time period when the output of the drive circuit is changed, thus it is capable of providing high speed drive circuit. As a result thereof, there is obtained the effect that it is capable of providing the drive circuit which drives the long wiring in high speed while realizing reduced area, and the reception circuit for receiving that signal in high speed.

While preferred embodiments of the invention have been described using specific terms, the description has been for illustrative purposes only, and it is to be understood that changes and variations may be made without departing from the spirit or scope of the following claims.

What is claimed is:

1. A semiconductor integrated circuit comprising:
   a first p-type MOS transistor whose source is connected to an electric power-supply, whose gate is connected to a first node, and whose drain is connected to a second node;

a second p-type MOS transistor whose source is connected to said second node, whose gate is connected to a first input terminal, and whose drain is connected to a first output terminal;

a first n-type MOS transistor whose source is con-nected to ground, whose gate is connected to a fifth node, and whose drain is connected to a third node;

a second n-type MOS transistor whose source is connected to said third node, whose gate is connected to said first input terminal, and whose drain is connected to said first output terminal; and a logic circuit connected to receive as inputs said first output terminal and a second input terminal, said logic circuit having a first output connected to drive said first node and a second output connected to drive said fifth node.

2. A semiconductor integrated circuit as claimed in claim 1, further comprising;
   a first inverter in which said first output terminal is taken as an input of said first inverter, and a fourth node is taken as an output of said first inverter; and
   a second inverter in which said fourth node is taken to be an input of said second inverter, and a first output terminal is taken to be an output of said second inverter.

3. A semiconductor integrated circuit as claimed in claim 2, wherein said semiconductor integrated circuit constitutes a reception circuit for receiving signal from an external circuit.

4. A semiconductor integrated circuit as claimed in claim 1, wherein said semiconductor integrated circuit constitutes a reception circuit for receiving signal from an external circuit.

5. The semiconductor integrated circuit of claim 1, wherein the logic circuit is constructed to selectively operate in one of three modes, comprising:
   a first mode, in which both the first p-type MOS transistor and the first n-type MOS transistor are disabled, so that the first output terminal is put into a floating state;
   a second mode, in which both the first p-type MOS transistor and the first n-type MOS transistor are enabled, so that the semiconductor integrated circuit operates as an inverter; and
   a third mode, in which the first p-type MOS transistor and the first n-type MOS transistor are independently controlled.

6. The semiconductor integrated circuit of claim 5, wherein the logic circuit is constructed to operate so that during transitions of the first output terminal, the first p-type MOS transistor and the first n-type MOS transistor are controlled so that there is no point at which all of the first and second p-type MOS transistors and the first and second n-type MOS transistors are simultaneously in an ON state.

* * * * *